(12) United States Patent
Roshelli, Jr. et al.

(10) Patent No.: US 7,202,008 B2
(45) Date of Patent: Apr. 10, 2007

(54) THERMAL DEVELOPMENT SYSTEM AND METHOD OF USING THE SAME

(76) Inventors: Albert Roshelli, Jr., 1105 Astoria La., Peachtree City, GA (US) 30269; Gary T. Markhart, 2904 Corte Celeste, Carlsbad, CA (US) 92009

( * ) Notice: Subject to any disclaimer, the term of this patent is extended or adjusted under 35 U.S.C. 154(b) by 170 days.

(21) Appl. No.: 11/159,704

(22) Filed: Jun. 23, 2005

(65) Prior Publication Data

US 2006/0292495 A1 Dec. 28, 2006

(51) Int. Cl.
- *G03F 7/34* (2006.01)
- *B30B 15/34* (2006.01)
- *B30B 5/02* (2006.01)
- *B32B 31/00* (2006.01)
- *B32B 31/04* (2006.01)

(52) U.S. Cl. .................. 430/254; 430/306; 430/330; 156/234; 156/540; 156/552; 156/583.5; 156/584; 156/499

(58) Field of Classification Search .............. 430/254, 430/17, 306, 325, 330; 156/234, 499, 540, 156/552, 583.5, 584
See application file for complete search history.

(56) References Cited

U.S. PATENT DOCUMENTS

| | | | |
|---|---|---|---|
| 3,264,103 A | 8/1966 | Cohen et al. | |
| 5,003,873 A | 4/1991 | Lauber | |
| 5,175,072 A | 12/1992 | Martens | |
| 5,262,275 A | 11/1993 | Fan | |
| 5,279,697 A | 1/1994 | Peterson et al. | |
| 5,925,500 A | 7/1999 | Yang et al. | |
| 6,238,837 B1 | 5/2001 | Fan | |
| 6,797,454 B1 | 9/2004 | Johnson et al. | |
| 2002/0164494 A1 | 11/2002 | Grant et al. | |
| 2003/0180655 A1 | 9/2003 | Fan et al. | |
| 2003/0211423 A1 | 11/2003 | Mengel et al. | |
| 2005/0084791 A1 | 4/2005 | Hackler et al. | |
| 2006/0029880 A1* | 2/2006 | McMillen et al. | 430/199 |

FOREIGN PATENT DOCUMENTS

| | | |
|---|---|---|
| EP | 1 239 329 A2 | 9/2002 |
| WO | WO 01/18604 A2 | 3/2001 |
| WO | WO 01/88615 A1 | 11/2001 |

* cited by examiner

*Primary Examiner*—Richard L. Schilling
(74) *Attorney, Agent, or Firm*—Carmody & Torrance LLP

(57) ABSTRACT

An improved apparatus and a method of using the apparatus to remove non-crosslinked photopolymer from an imaged and exposed surface of a relief image printing element. Included are means for supporting and rotating the printing element, means for softening and/or melting non-crosslinked photopolymer on the imaged and exposed surface of the printing element, and at least one thermal developing assembly. The thermal developing assembly includes means for supplying an absorbent material that is contactable with the printing element, and that is capable of removing at least a portion of the softened and/or melted non-crosslinked photopolymer, and means for causing the absorbent material to contact at least a portion of the printing element. The absorbent material is backed with an endless impression belt that is supported by a plurality of rollers. When the absorbent material contacts the surface of the printing element, softened and/or melted non-crosslinked photopolymer on the surface of the printing element is removed.

25 Claims, 2 Drawing Sheets

THERMAL DEVELOPMENT SYSTEM AND METHOD OF USING THE SAME

FIELD OF THE INVENTION

The present invention is directed to an improved system for thermally developing relief image printing elements and a method of using the same.

BACKGROUND OF THE INVENTION

Flexography is a method of printing that is commonly used for high-volume runs. Flexography is employed for printing on a variety of substrates such as paper, paperboard stock, corrugated board, films, foils and laminates. Newspapers and grocery bags are prominent examples. Coarse surfaces and stretch films can be economically printed only by means of flexography. Flexographic printing plates are relief plates with image elements raised above open areas. Such plates offer a number of advantages to the printer, based chiefly on their durability and the ease with which they can be made.

Although photopolymer printing elements are typically used in "flat" sheet form, there are particular applications and advantages to using the printing element in a continuous cylindrical form, as a continuous in-the-round (CITR) photopolymer sleeve. CITR photopolymer sleeves add the benefits of digital imaging, accurate registration, fast mounting, and no plate lift to the flexographic printing process. CITR sleeves have applications in the flexographic printing of continuous designs such as in wallpaper, decoration and gift-wrapping paper, and other continuous designs such as tablecloths, etc. CITR sleeves enable flexographic printing to be more competitive with gravure and offset on print quality.

A typical flexographic printing plate as delivered by its manufacturer, is a multilayered article made of, in order, a backing or support layer, one or more unexposed photocurable layers, a protective layer or slip film, and a cover sheet. A typical CITR photopolymer sleeve generally comprises a sleeve carrier (support layer) and at least one unexposed photocurable layer on top of the support layer.

A flexographic printing element is produced from a photocurable printing blank by imaging the photocurable printing blank to produce a relief image on the surface of the printing element. This is generally accomplished by selectively exposing the photocurable material to actinic radiation, which exposure acts to harden or crosslink the photocurable material in the irradiated areas. The photocurable printing blank contains one or more layers of an uncured photocurable material on a suitable backing layer. The photocurable printing blank can be in the form of a continuous (seamless) sleeve or as a flat, planar plate that is mounted on a carrier sleeve.

The photopolymers used generally contain binders, monomers, photoinitiators, and other performance additives. Photopolymer compositions include those described in U.S. patent application Ser. No. 10/353,446 filed Jan. 29, 2003, the teachings of which are incorporated herein by reference in their entirety. Various photopolymers such as those based on polystyrene-isoprene-styrene, polystyrene-butadiene-styrene, polyurethanes and/or thiolenes as binders are useful. Preferable binders are polystyrene-isoprene-styrene, and polystyrene-butadiene-styrene, especially block co-polymers of the foregoing.

The printing element is selectively exposed to actinic radiation in one of three related ways. In the first alternative, a photographic negative with transparent areas and substantially opaque areas is used to selectively block the transmission of actinic radiation to the printing plate element. In the second alternative, the photopolymer layer is coated with an actinic radiation (substantially) opaque layer that is sensitive to laser ablation. A laser is then used to ablate selected areas of the actinic radiation opaque layer creating an in situ negative. This technique is well-known in the art, and is described for example in U.S. Pat. Nos. 5,262,275 and 6,238,837 to Fan, and in U.S. Pat. No. 5,925,500 to Yang et al., the subject matter of each of which is herein incorporated by reference in its entirety. In the third alternative, a focused beam of actinic radiation is used to selectively expose the photopolymer. Any of these alternative methods is acceptable, with the criteria being the ability to selectively expose the photopolymer to actinic radiation thereby selectively curing portions of the photopolymer.

Next, the photopolymer layer of the printing element is developed to remove uncured (i.e., non-crosslinked) portions of the photopolymer, without disturbing the cured portions of the photopolymer layer, to produce the relief image. The development step has traditionally been accomplished in a variety of ways, including water washing, solvent washing, and thermal development (blotting). Thermal development has the advantage of not requiring an additional drying step after development and thus provides the ability to go more quickly from plate to press.

Processes have been developed whereby photopolymer printing plates are prepared using heat and the differential melting temperature between cured and uncured photopolymer is used to develop the latent image. The basic parameters of this process are known, as described in U.S. Pat. Nos. 5,279,697, 5,175,072 and 3,264,103, in published U.S. patent publication Nos. US 2003/0180655, and U.S. 2003/0211423, and in WO 01/88615, WO 01/18604, and EP 1239329, the teachings of each of which are incorporated herein by reference in their entirety. These processes allow for the elimination of development solvents and the lengthy plate drying times needed to remove the solvent. The speed and efficiency of these processes allow for their use in the manufacture of flexographic plates for printing newspapers and other publications where quick turnaround times and high productivity are important.

In order for the printing plate to be thermally developable, the composition of the photopolymer must be such that there exists a substantial difference in the melt temperature between the cured and uncured polymer. It is precisely this difference that allows the creation of an image in the photopolymer when heated. The uncured photopolymer (i.e., the portions of the photopolymer not contacted with actinic radiation) melts and/or substantially softens while the cured photopolymer remains solid and intact at the temperature chosen. Thus, the difference in melt temperature allows the uncured photopolymer to be selectively removed thereby creating the desired image.

During thermal development, the printing element is generally heated to a temperature of at least about 70° C. The exact temperature depends upon the properties of the particular photopolymer being used. However, two primary factors should be considered in determining the development temperature:

1. The development temperature is preferably set between the melt temperature of the uncured photopolymer on the low end and the melt temperature of the cured photopolymer on the upper end. This will allow selective removal of the photopolymer, thereby creating the image.

2. The higher the development temperature, the quicker the process time will be. However, the development temperature should not be so high as to exceed the melt temperature of the cured photopolymer or so high that it will degrade the cured photopolymer. The temperature should be sufficient to melt or substantially soften the uncured photopolymer thereby allowing it to be removed.

Thereafter, uncured photopolymer can be softened and/or melted and removed. In most instances, the heated printing element is contacted with an absorbent material that absorbs or otherwise removes the softened and/or melted uncured photopolymer. This removal process is generally referred to as "blotting".

Upon completion of the blotting process, the printing plate element may be post-exposed to further actinic radiation and/or subjected to detackification, cooled and is then ready for use.

While various thermal development apparatuses have been developed for use in the production of relief image printing plates, there remains a need in the art for a thermal developing device that can provide more efficient removal of uncured photopolymer. There also remains a need in the art for an improved thermal development process that permit a uniform application of heat and allow the blotting material to more fully remove uncured photopolymer remaining on the imaged and exposed surface of the relief image printing element.

The inventors of the present invention have determined that better contact between the blotting (absorbent) material and an imaged and exposed surface of a relief image printing element can be obtained by backing the blotting material with an endless impression belt so that more of the blotting material contacts the surface of the relief image printing element, thereby effecting better removal of the uncured photopolymer from the imaged and exposed surface of the relief image printing element.

SUMMARY OF THE INVENTION

It is an object of the present invention to provide an apparatus for thermally developing relief image printing elements with increased speed, reduced blotter consumption, and reduction of dot damage.

It is another object of the present invention to provide a thermal development apparatus that increases the contact time between the absorbent blotting material and the imaged and exposed surface of a relief image printing element to provide more complete removal of uncured photopolymer.

To that end, the present invention is directed to an improved thermal development apparatus and a method of using the improved thermal development apparatus to remove uncured photopolymer from the imaged surface of a flexographic printing element.

In a preferred embodiment, the apparatus comprises:
  a) means for supporting, and preferably transporting, the relief image printing element;
  b) means for softening and/or melting non-crosslinked photopolymer on the imaged and exposed surface of the relief image printing element; and
  c) at least one first thermal developing assembly comprising:
    i) means for supplying an absorbent material that is contactable with at least a portion of the imaged and exposed surface of the relief image printing element, wherein the absorbent material is capable of removing at least a portion of the softened and/or melted non-crosslinked photopolymer; and
    ii) means for causing the absorbent material to contact the at least the portion of the imaged and exposed surface of the relief image printing element; wherein said contact means comprises backing the absorbent material with at least a portion of an endless impression belt that is supported by a plurality of rollers positioned adjacent and apart from each other.

When the absorbent material contacts at least a portion of the imaged and exposed surface of the relief image printing element, softened and/or melted non-crosslinked photopolymer on the imaged and exposed surface of the relief image printing element is removed.

In one embodiment, the plurality of rollers are positioned apart from the relief image printing element, so that the portion of the impression belt that contacts the at least the portion of the imaged surface of the relief image printing element is maximized.

In another embodiment, the apparatus of the invention comprises a second thermal developing assembly having the same components as the first thermal developing assembly. If used, the second thermal developing assembly is typically arranged on an opposite side of the relief image printing element from the first thermal developing assembly.

The invention also comprises a method of using the thermal development apparatus of the invention comprising the steps of:
  a) providing an imaged and exposed relief image printing element;
  b) softening and/or melting non-crosslinked photopolymer on the imaged and exposed surface of the relief image printing element; and
  c) supplying an absorbent material that is contactable with at least a portion of the imaged and exposed surface of the relief image printing element and capable of removing the softened and/or melted non-crosslinked photopolymer on the surface of the relief image printing element;

wherein the absorbent material is backed by at least a portion of an endless impression belt and contacts the at least the portion of the relief image printing element so that at least a portion of the softened and/or melted non-crosslinked photopolymer is removed by the absorbent material.

BRIEF DESCRIPTION OF THE DRAWINGS

For a fuller understanding of the invention, reference is had to the following description taken in connection with the accompanying figures, in which.

Also, while not all elements are labeled in each figure, all elements with the same reference number indicate like or similar parts.

DETAILED DESCRIPTION OF THE PREFERRED EMBODIMENTS OF THE INVENTION

The present invention is directed to an improved thermal development apparatus and a method of using the apparatus to remove non-crosslinked polymer from an imaged surface of a relief image printing element during a process for manufacturing the relief image printing element that overcomes many of the deficiencies of the prior art.

Immediately prior to removal of the non-crosslinked polymer in the thermal developing apparatus, the flexographic printing element is selectively exposed to actinic radiation to selectively crosslink and cure imaged portions of the flexographic printing element, as is well known in the art. Then, the printing element may be thermally developed using the improved apparatus of the invention to reveal the relief image in the surface.

Figure 1:
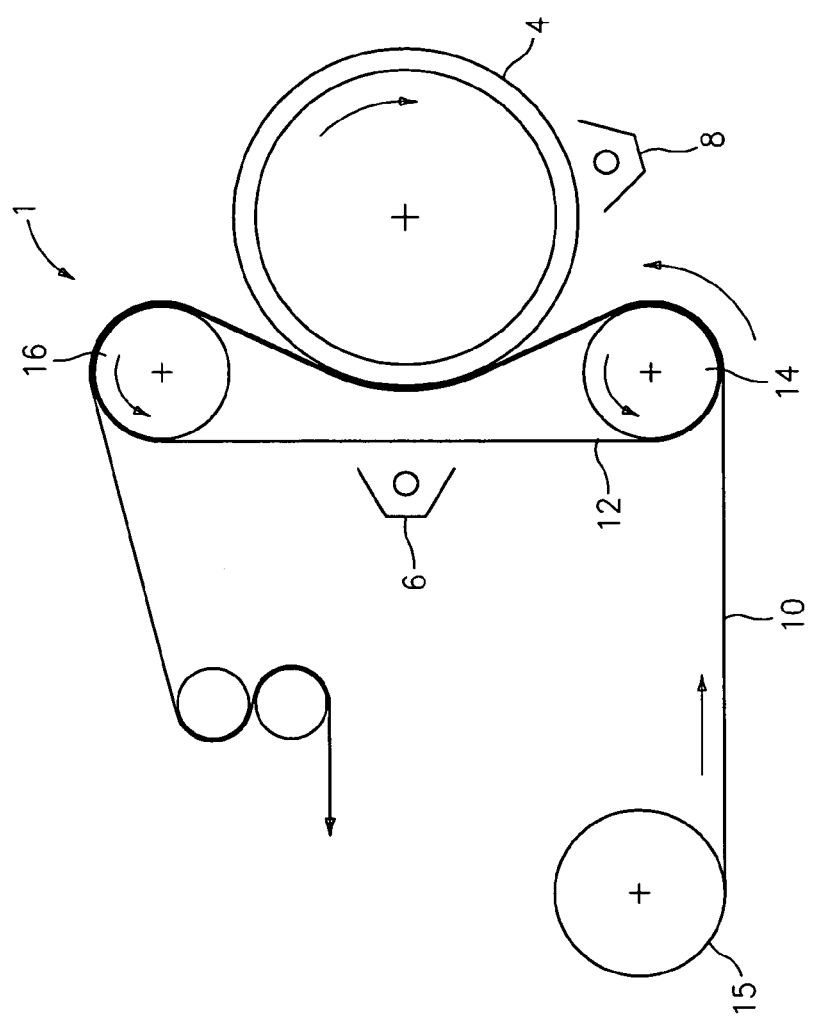
FIG. 1 depicts one embodiment of the thermal development apparatus of the instant invention.

As seen in FIG. 1, the apparatus 1 of the invention comprises means for supporting, and preferably rotating or otherwise transporting, an imaged and exposed relief image printing element 4, which can be typically mounted on a cylindrical printing mandrel 2. The apparatus 1 also comprises means for softening and/or melting non-crosslinked photopolymer on the imaged and exposed surface of the relief image printing element 4, said means for softening and/or melting comprising the provision of heat to the surface of the printing element through I.R. radiation, heat convection and/or heat conduction. Finally, the apparatus 1 of the invention comprises at least one thermal developing assembly. The at least one thermal developing assembly comprises means for supplying a web of absorbent material 10 that is contactable with at least a portion of the imaged and exposed surface of the relief image printing element 4, and means for causing the absorbent material 10 to contact the at least the portion of the imaged and exposed surface of the relief image printing element 4, said means of contact comprising backing the web of absorbent material 10 with at least a portion of an endless impression belt 12 that is supported by a plurality of rollers 14 and 16 positioned adjacent and apart from each other.

The absorbent material 10 is chosen so that it is capable of removing at least a portion of the softened and/or melted non-crosslinked photopolymer. When the absorbent material 10 contacts the at least the portion of the imaged and exposed surface of the relief image printing element 4, softened and/or melted non-crosslinked photopolymer on the imaged and exposed surface of the relief image printing element 4 is removed.

In a preferred embodiment and as depicted in FIG. 1, the plurality of rollers 14 and 16 are positioned apart from the relief image printing element 4, so that the portion of the impression belt 12 that contacts (through the absorbent material) the at least the portion of the imaged surface of the relief image printing element 4 is maximized. Preferably, the absorbent material 10, the impression belt 12, and the plurality of rollers 14 and 16 are each approximately the width of the relief image printing element 4. Tensioning or pressure point rollers can optionally be added at various points in the area where the absorbent material is forced into contact with the printing element so as to increase the contact pressure.

The means for softening and/or melting the non-crosslinked photopolymer on the imaged and exposed surface of the relief image printing element 4 comprises a heat source 6 that is positioned behind the impression belt 12, and/or a heat source 8 that is positioned adjacent to the relief image printing element 4 and/or a heat source located in rollers located in direct or indirect contact with the printing element through the belt and/or the absorbent material. The location of the heat source 8 that is positioned adjacent to the relief image printing element 4 is not critical, however it is preferred that the heat source be positioned adjacent to the location at which the relief image printing element 4 contacts the web of absorbent material 10 in order to provide the most complete removal of the melted and/or softened uncured photopolymer. Typically, the heating source 6 and/or 8 is an infrared heater or a hot air heater, although other heating sources would also be known to one skilled in the art and would be suitable for use in the present invention. In another alternative, the belt can be heated using a heated platen (not shown) that is brought in contact with the belt. Preferably, the platen is constructed with a highly heat conductive metal and is heated via an electrical resistance heating element. The platen may be positioned at any point but is preferably positioned between the plurality of roller 14 and 16. In yet another alternative a flexible heating element may be built into the belt itself.

In another preferred embodiment, the absorbent material 10 is continuously supplied to the at least the portion of the surface of the impression belt 12 from a remote source of the absorbent material 15. The apparatus 1 may also comprise a rewind device (not shown) to carry away the absorbent material 10 containing the removed non-crosslinked photopolymer. Various materials may be used for the absorbent material 10, although paper, non-woven fabrics and woven fabrics are generally preferred. Examples of absorbent materials 10 that are usable include screen mesh and absorbent fabrics, including polymer-based and non-polymer-based fabrics.

The impression belt 12 most preferably maintains the absorbent material 10 against the at least the portion of the surface of the relief image printing element by means of an air cylinder or a hydraulic cylinder (not shown) that forces rollers supporting the impression belt 12 towards the imaged surface of the relief image printing element 4. Other means for maintaining the contact between the absorbent material 10 and the relief image printing element 4 would also be known to one skilled in the art. If only one thermal developing assembly is used, it may be preferred to rotate the plurality of rollers 14 and 16 supporting the impression belt rotate in a first direction, so that the absorbent material 10 moves over the at least the portion of the relief image printing element 4, and to rotate the cylindrical printing mandrel 2 supporting the relief image printing element 4 in an opposite direction. However, the direction of rotation of the plurality of rollers 14 and 16 and of the printing mandrel 2 as well as the speed at which each is rotated are not critical to the practice of the invention and a person skilled in the art would be able to determine the appropriate direction of rotation and speed in order to achieve the best removal of uncured photopolymer for a particular application. The thermal developing assembly can be designed to be the width of the relief image printing element or can be smaller than the foregoing width, in which case the thermal developing assembly must spiral across the face of the relief printing element so that substantially the entire surface is developed.

Figure 2:
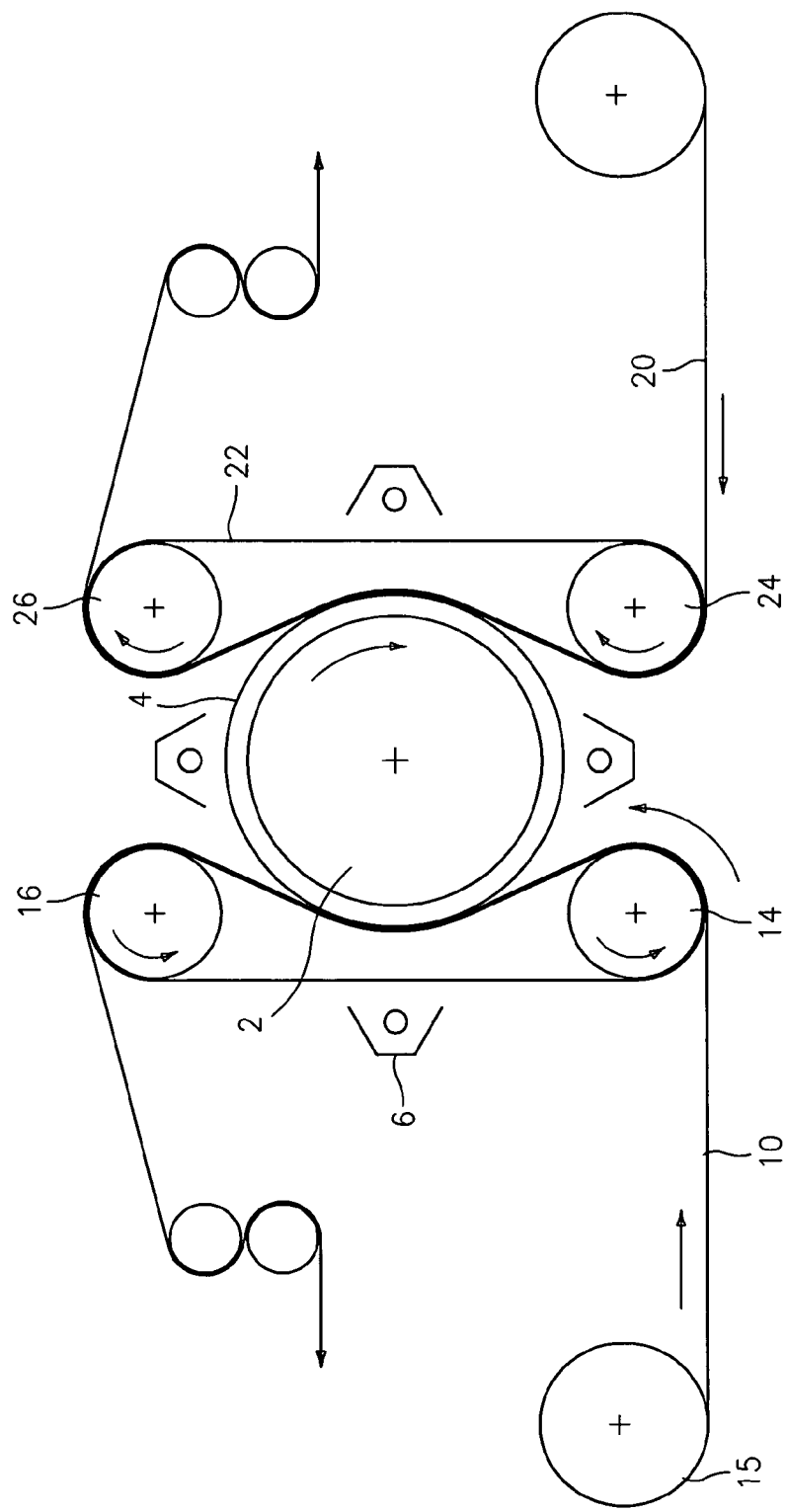
FIG. 2 depicts another embodiment of the thermal development apparatus of the invention.

In another embodiment, as seen in FIG. 2, the apparatus of the invention may further comprise a second thermal developing assembly having the same components as the first thermal developing assembly. The second thermal developing assembly is most preferably arranged on an opposite side of the relief image printing element 4 from the first thermal developing assembly. The second thermal developing assembly comprises a second means for supplying a second web of absorbent material 20 that is contactable with at least a second portion of the relief image printing element 4, a second endless belt 22 for holding the second web of absorbent material 20 against the second portion of the imaged and exposed surface of the relief image printing element 4, and is supported by a second plurality of rollers 24 and 26.

Use of the second thermal developing assembly may minimize or substantially eliminate roll bending and machine stiffness design problems, which can cause uneven floors in large flat plate machines. Also, since the high forces required to push the blotter into the resin oppose each other, the improved design features of the invention allow for the use of much lighter materials (i.e., fiberglass instead of steel support shafts) to support the printing sleeve while it is being processed.

Various types of relief image printing elements can be thermally developed using the improved apparatus of the invention. For example, the relief image printing element may be a flat printing plate that is secured to a cylindrical mandrel by various means, including vacuum, adhesives and/or mechanical clamps, and is supported by the cylindrical mandrel. In the alternative, the relief image printing element may be an integral seamless cylindrical printing element. In a third alternative, the printing element may be a flat printing element transported on a conveyor with the impression belt and the absorbent material coming into contact from above the printing element.

The present invention is also directed to a method of developing a relief image printing element to remove non-crosslinked photopolymer on an imaged and exposed surface of the relief image printing element using the apparatus of the invention.

The method typically comprises the steps of:
1) providing an imaged and exposed relief image printing element mounted on a support;
2) softening and/or melting non-crosslinked photopolymer on the imaged and exposed surface of the relief image printing element; and
3) supplying an absorbent material that is contactable with at least a portion of the imaged and exposed surface of the relief image printing element and capable of removing the softened and/or melted non-crosslinked photopolymer on the surface of the relief image printing element; wherein said absorbent material is contacted with the printing element through use of an impression belt.

As described above, the absorbent material is backed by at least a portion of an endless impression belt that causes the absorbent material to contact the at least the portion of the relief image printing element, so that at least a portion of the softened and/or melted non-crosslinked photopolymer is removed by the absorbent material. The impression belt is supported by a plurality of rollers that are positioned adjacent and apart from each other.

The method may also include a further step of detacking and post-curing the exposed and thermally developed printing element as is well known in the art.

While the invention has been particularly shown and described with respect to its preferred embodiments, it will be understood by those skilled in the art that changes in form and details may be made therein without departing from the scope and spirit of the invention.

What is claimed is:

1. An apparatus for removing non-crosslinked photopolymer from an imaged and exposed surface of a relief image printing element, the apparatus comprising:
   means for supporting, and preferably transporting or rotating, the relief image printing element;
   means for softening and/or melting non-crosslinked photopolymer on the imaged and exposed surface of the relief image printing element;
   at least one thermal developing assembly, the at least one thermal developing assembly comprising:
      means for supplying an absorbent material that is contactable with at least a portion of the imaged and exposed surface of the relief image printing element, wherein the absorbent material is capable of removing at least a portion of the softened and/or melted non-crosslinked photopolymer; and
      means for causing the absorbent material to contact the at least the portion of the imaged and exposed surface of the relief image printing element;
   wherein said means contacting comprises backing the absorbent material with at least a portion of an endless impression belt that is supported by a plurality of rollers positioned adjacent and apart from each other;
   whereby, when the absorbent material contacts the at least a portion of the imaged and exposed surface of the relief image printing element, and softened and/or melted non-crosslinked photopolymer on the imaged and exposed surface of the relief image printing element is removed.

2. The apparatus according to claim 1, wherein the plurality of rollers are positioned apart from the relief image printing element, whereby the portion of the impression belt that contacts the at least the portion of the imaged surface of the relief image printing element is maximized.

3. The apparatus according to claim 1, wherein the plurality of rollers and the impression belt are each approximately the width of the relief image printing element.

4. The apparatus according to claim 1, wherein the means for softening and/or melting the non-crosslinked photopolymer on the imaged and exposed surface of the relief image printing element comprises at least one heat source selected from the group consisting of a heat source positioned behind the impression belt, a heat source positioned adjacent to the relief image printing element, a heated platten in contact with the impression belt, heated rollers, and a flexible heat source incorporated into the impression belt.

5. The apparatus according to claim 1, wherein the absorbent material is continuously supplied to the at least the portion of the surface of the impression belt from a remote source of the absorbent material.

6. The apparatus according to claim 5, further comprising a rewind device to carry away the absorbent material containing the removed non-crosslinked photopolymer.

7. The apparatus according to claim 1, wherein the absorbent material is selected from the group consisting of paper, non-woven fabrics and woven fabrics.

8. The apparatus according to claim 1, wherein the impression belt maintains the absorbent material against the at least the portion of the surface of the relief image printing element by using an air cylinder or a hydraulic cylinder to force the impression belt towards the imaged surface of the relief image printing element.

9. The apparatus according to claim 1, wherein the at least one thermal developing assembly comprises two thermal developing assemblies that are arranged on opposite sides of the relief image printing element.

10. The apparatus according to claim 1, wherein the at least one thermal developing assembly comprises one thermal developing assembly, and the plurality of rollers supporting the impression belt rotate in a first direction, and the relief image printing element rotates in an opposite direction.

11. The apparatus according to claim 4, wherein the heating source is selected from the group consisting of an infrared heater, a hot air heater, an electrical resistance heater, and combinations of the foregoing.

12. The apparatus according to claim 1, wherein the relief image printing element is a flat printing plate that is secured to and supported by a cylindrical mandrel.

13. The apparatus according to claim 1, wherein the thermal developing assembly spirals across the width of the relief image printing element.

14. The apparatus according to claim 1, wherein the relief image printing element is an integral seamless cylindrical printing element.

15. A method of developing a relief image printing element to remove non-crosslinked photopolymer on an imaged and exposed surface of the relief image printing element, the method comprising the steps of:
   a) providing an imaged and exposed relief image printing element mounted on a support;
   b) softening and/or melting non-crosslinked photopolymer on the imaged and exposed surface of the relief image printing element; and
   c) supplying an absorbent material that is contactable with at least a portion of the imaged and exposed surface of the relief image printing element and capable of removing the softened and/or melted non-crosslinked photopolymer on the surface of the relief image printing element, wherein said absorbent material is backed by at least a portion of an endless impression belt that causes the absorbent material to contact the at least the portion of the relief image printing element; whereby at least a portion of the softened and/or melted non-crosslinked photopolymer is removed by the absorbent material.

16. The method according to claim 15, wherein the impression belt is supported by a plurality of rollers, wherein said plurality of rollers are positioned adjacent and apart from each other.

17. The method according to claim 16, wherein the portion of the absorbent material on the impression belt that contacts the imaged surface of the relief image printing element is maximized by positioning the plurality of rollers apart from the relief image printing element.

18. The method according to claim 16, wherein the absorbent material, the impression belt, and the plurality of rollers are each approximately the width of the relief image printing element.

19. The method according to claim 15, wherein the non-crosslinked photopolymer is melted and/or softened by positioning a heat source behind the impression belt and/or adjacent to the relief image printing element.

20. The method according to claim 15, comprising the step of continuously supplying the absorbent material to the at least the portion of the surface of the impression belt from a remote source of the absorbent material.

21. The method according to claim 20, further comprising the step of carrying away and rewinding the absorbent material containing the removed non-crosslinked photopolymer.

22. The method according to claim 15, wherein the absorbent material is selected from the group consisting of paper, non-woven fabrics, and woven fabrics.

23. The method according to claim 19, wherein the heating source is selected from the group consisting of an infrared heater or a hot air heater, an electrical resistance heater and combinations of the foregoing.

24. The method according to claim 15, wherein the relief image printing element is a flat printing plate that is secured to a cylindrical mandrel.

25. The method according to claim 15, wherein the relief image printing element is an integral seamless cylindrical printing element.

* * * * *